United States Patent
Matsunaga et al.

(10) Patent No.: US 11,881,047 B2
(45) Date of Patent: Jan. 23, 2024

(54) OPTICAL SENSOR

(71) Applicant: Japan Display Inc., Tokyo (JP)

(72) Inventors: Kazuki Matsunaga, Tokyo (JP); Shigesumi Araki, Tokyo (JP); Yasushi Tomioka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/119,931

(22) Filed: Mar. 10, 2023

(65) Prior Publication Data
US 2023/0298379 A1    Sep. 21, 2023

(30) Foreign Application Priority Data
Mar. 16, 2022  (JP) .................................. 2022-041354

(51) Int. Cl.
*G06V 40/13*  (2022.01)
*H01L 27/146*  (2006.01)

(52) U.S. Cl.
CPC ...... *G06V 40/1318* (2022.01); *G06V 40/1324* (2022.01); *H01L 27/14627* (2013.01)

(58) Field of Classification Search
CPC ............ G06V 40/1318; G06V 40/1324; H01L 27/14625; H01L 27/14627
See application file for complete search history.

(56) References Cited

U.S. PATENT DOCUMENTS

2021/0045705 A1   2/2021  Morii et al.
2023/0020242 A1*  1/2023  Martinsson ............ G02B 3/005

FOREIGN PATENT DOCUMENTS

WO    2019/167145 A1    2/2021

* cited by examiner

*Primary Examiner* — Kevin K Pyo
(74) *Attorney, Agent, or Firm* — Michael Best & Friedrich LLP

(57) ABSTRACT

An optical sensor capable of obtaining a plurality of types of information by a plurality of wavelengths in a short time is provided. The optical sensor includes a light receiving unit that includes a first and second pinhole layer that includes a plurality of pinholes, a first and second transmission layer, and a plurality of microlenses belonging to a first and second group, the microlenses being disposed at positions respectively overlapping the plurality of pixels on the second transmission layer. Either of the plurality of microlenses belonging to the first or second group is a first wavelength selection unit that transmits light of a first wavelength. At least one of the other of the plurality of microlenses belonging to the first and second group, the first transmission layer, and the second transmission layer is a second wavelength selection unit that transmits light of a second wavelength.

9 Claims, 14 Drawing Sheets

OPTICAL SENSOR

CROSS-REFERENCE TO RELATED APPLICATION

The present application claims priority from Japanese Application No. JP2022-41354 filed on Mar. 16, 2022, the content of which is hereby incorporated by reference into this application.

BACKGROUND OF THE INVENTION

1. Field of the Invention

The present invention relates to an optical sensor.

2. Description of the Related Art

The optical sensor irradiates a measurement target with light of a specific wavelength and senses reflected light and transmitted light from the measurement target, thereby acquiring predetermined information. For example, the optical sensor irradiates a finger with visible light and senses reflected light and transmitted light, thereby acquiring information of the fingerprint. Further, the optical sensor irradiates a finger with near-infrared light and senses transmitted light, thereby also acquiring information of the vein.

The methods of extracting only parallel light from scattered light includes a method using a collimator (see WO2019/167145).

The optical sensor sequentially irradiates the measurement target with light of a plurality of wavelengths at intervals and senses reflected light and transmitted light from the measurement target, thereby acquiring a plurality of types of information related to the measurement target. However, such a manner may require a long time to acquire all of the plurality of types of information.

One or more embodiments of the present invention have been conceived in view of the above, and an object thereof is to provide an optical sensor capable of acquiring a plurality of types of information with a plurality of wavelengths in a short time.

An optical sensor according to an aspect of the present disclosure includes a light receiving unit that includes a plurality of pixels disposed in a matrix on a plane and receives light from a measurement target, a first pinhole layer that includes a plurality of pinholes provided at positions respectively overlapping the plurality of pixels, a first transmission layer that is disposed on the first pinhole layer and transmits light, a second pinhole layer that includes a plurality of pinholes provided at positions respectively overlapping the plurality of pixels and is disposed on the first transmission layer, a second transmission layer that is disposed on the second pinhole layer and transmits light, and a plurality of microlenses belonging to a first group and a plurality of microlenses belonging to a second group, where the microlenses are disposed at positions respectively overlapping the plurality of pixels on the second transmission layer. Either of the plurality of microlenses belonging to the first group or the plurality of microlenses belonging to the second group are a first wavelength selection unit that transmits light of a first wavelength, and at least one of the other of the plurality of microlenses belonging to the first group and the plurality of microlenses belonging to the second group, the first transmission layer, and the second transmission layer is a second wavelength selection that transmits light of a second wavelength.

According to the present disclosure, it is possible to acquire a plurality of types of information with a plurality of wavelengths in a short time.

DETAILED DESCRIPTION OF THE INVENTION

Embodiments of the present invention will be described below in detail with reference to the accompanying drawings. In this regard, the present invention is not to be limited to the embodiments described below, and can be changed as appropriate without departing from the spirit of the invention.

The accompanying drawings may schematically illustrate widths, thicknesses, shapes, or other characteristics of each part for clarity of illustration, compared to actual configurations. However, such a schematic illustration is merely an example and not intended to limit the present invention. In this specification and the drawings, some elements identical or similar to those shown previously are denoted by the same reference signs as the previously shown elements, and thus repetitive detailed descriptions of them may be omitted as appropriate.

Further, in the detailed description of the present invention, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

First Embodiment

Figure 1:
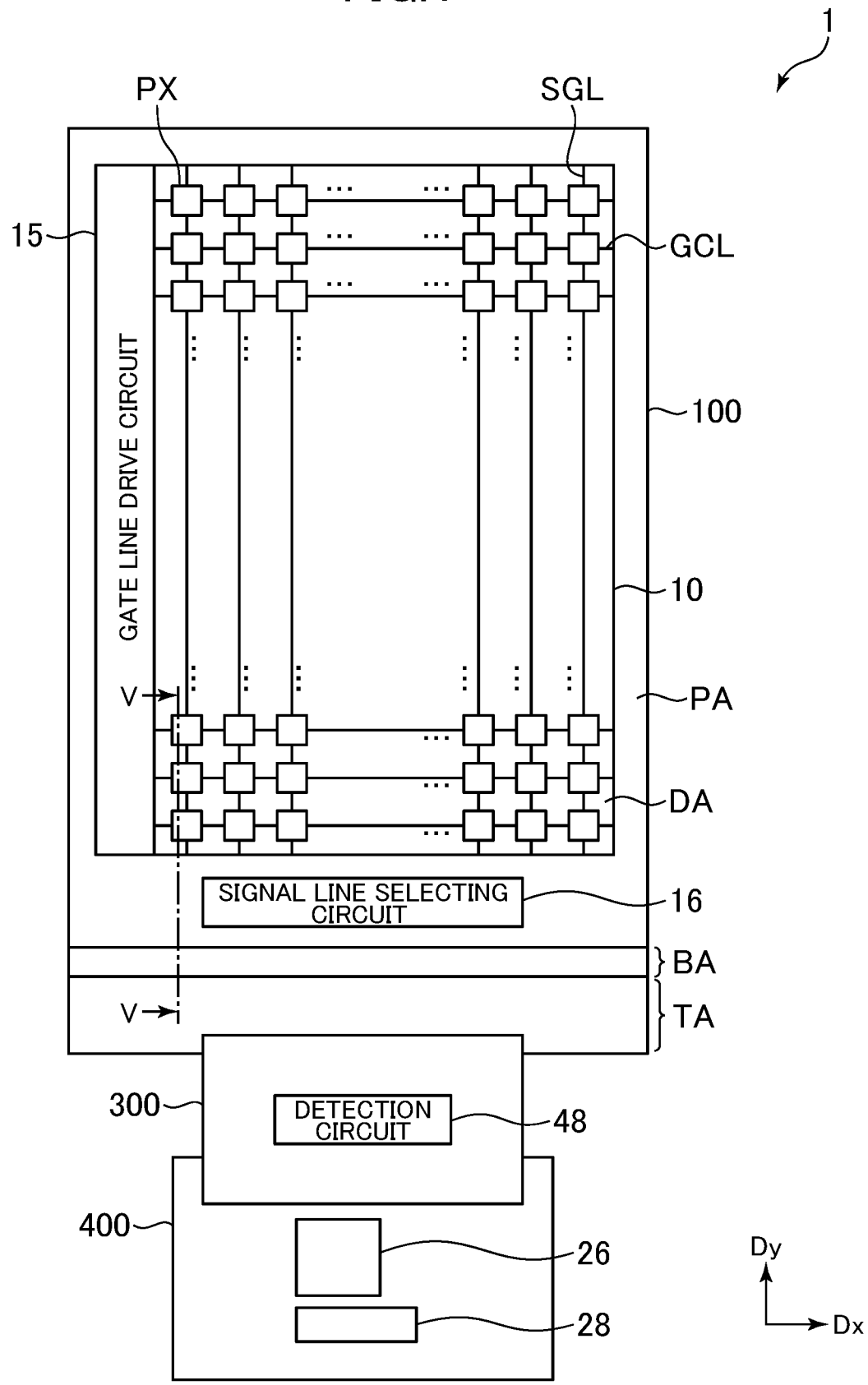
FIG. 1 is a schematic plan view of an optical sensor.

FIG. 1 is a schematic plan view of an optical sensor 1 according to the first embodiment of the present invention. As shown in FIG. 1, the optical sensor 1 includes a resin substrate 100, a light receiving unit 10, a gate line drive circuit 15, a signal line selecting circuit 16, a control circuit 26, a power supply circuit 28, a detection circuit 48, a flexible printed circuit board 300, and a control substrate 400.

The control substrate 400 is electrically connected to the resin substrate 100 via the flexible printed circuit board 300. The flexible printed circuit board 300 includes the detection circuit 48. The control substrate 400 includes the control circuit 26 and the power supply circuit 28. The control circuit 26 supplies control signals to the light receiving unit 10, the gate line drive circuit 15, and the signal line selecting circuit 16 to control the detecting operation of the light receiving unit 10. The detection circuit 48 and the control circuit 26 are IC (Integrated Circuit) and FPGA (Field Programmable Gate Array), for example. The power supply circuit 28 supplies a power supply voltage to the light receiving unit 10, the gate line drive circuit 15, and the signal line selecting circuit 16.

The resin substrate 100 includes a detection area DA and a frame area PA. The detection area DA is an area in which the light receiving unit 10 is provided. The frame area PA is an area outside the detection area DA where the light receiving unit 10 is not provided.

The frame area PA has a bending area BA and a terminal area TA. The bending area BA and the terminal area TA are provided at one end of the frame area PA. The wires connected to the detection area DA are disposed in the bending area BA and the terminal area TA. The resin substrate 100 and the flexible printed circuit board 300 are connected in the terminal area TA.

The light receiving unit 10 includes a plurality of pixels PX disposed in a matrix on the plane and receives light from a measurement target. Specifically, the light receiving unit 10 includes a plurality of pixels PX disposed in a matrix along a first direction Dx and a second direction Dy perpendicular to the first direction Dx in a plan view, and receives light from the measurement target. The first direction Dx is an extending direction of a gate line GCL, and the second direction Dy is an extending direction of a signal line SGL. The pixels PX are disposed in a matrix in the detection area DA. The pixels PX each include a photodiode 30 (see FIG. 4), and output an electric signal corresponding to light irradiated to each of the pixels. Each of the pixels PX outputs an electric signal, which corresponds to light irradiated to each pixel, to the signal line selecting circuit 16 as a first detection signal Vdet. Each of the pixels PX performs detection in accordance with the gate drive signal Vgcl supplied from the gate line drive circuit 15.

The gate line drive circuit 15 and the signal line selecting circuit 16 are provided in the frame area PA. Specifically, the gate line drive circuit 15 is provided in an area of the frame area PA that extends along the extension direction of the signal line SGL (second direction Dy). The signal line selecting circuit 16 is provided in an area of the frame area PA that extends along the extending direction of the gate line GCL (first direction Dx), and is provided between the light receiving unit 10 and the bending area BA.

Figure 2:
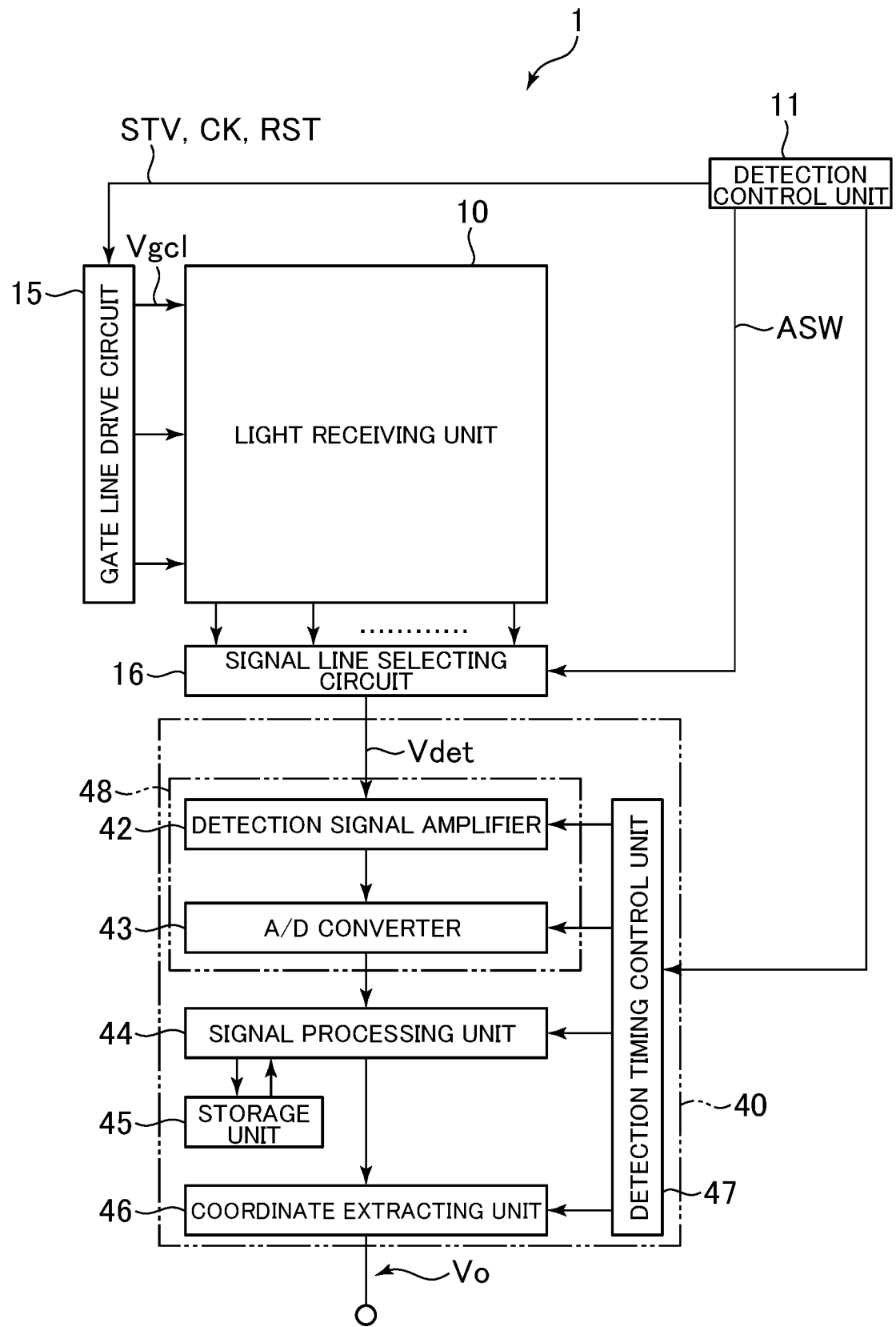
FIG. 2 is a block diagram showing an example of configuration of the optical sensor.

FIG. 2 is a block diagram showing an example of configuration of the optical sensor 1 according to the first embodiment of the present invention. As shown in FIG. 2, the optical sensor 1 further includes a detection control unit 11 and a detection unit 40. Some or all of the functions of the detection control unit 11 are included in the control circuit 26. Further, some or all of the functions of the detection unit 40 are included in the control circuit 26.

The detection control unit 11 is a circuit that supplies control signals to each of the gate line drive circuit 15, the signal line selecting circuit 16, and the detection unit 40, and controls their operations. The detection control unit 11 supplies control signals, such as a start signal STV, a clock signal CK, and a reset signal RST, to the gate line drive circuit 15. The detection control unit 11 supplies control signals, such as a selection signal ASW, to the signal line selecting circuit 16.

The gate line drive circuit 15 is a circuit that drives the gate line GCL based on the control signals. The gate line drive circuit 15 sequentially or simultaneously selects a plurality of gate lines GCL, and supplies the gate drive signal Vgcl to the selected gate line GCL. This makes the gate line drive circuit 15 to select the pixel PX connected to the gate line GCL.

The signal line selecting circuit 16 is a switching circuit that sequentially or simultaneously selects a plurality of signal lines SGL. The signal line selecting circuit 16 is a multiplexer, for example. The signal line selecting circuit 16 connects the selected signal line SGL with the detection circuit 48 based on the selection signal ASW supplied from the detection control unit 11. This enables the signal line selecting circuit 16 to output the first detection signal Vdet of the pixel PX to the detection unit 40.

The detection unit 40 includes a signal processing unit 44, a storage unit 45, a coordinate extracting unit 46, a detection timing control unit 47, and a detection circuit 48. The detection timing control unit 47 controls the signal processing unit 44, the coordinate extracting unit 46, and the detection circuit 48 to operate in synchronization based on the control signal supplied from the detection control unit 11.

The detection circuit 48 is an analog front end circuit (AFE), for example. The detection circuit 48 is a signal processing circuit having at least functions of a detection signal amplifier 42 and an A/D converter 43. The detection signal amplifier 42 amplifies the first detection signal Vdet. The A/D converter 43 converts an analog signal from the detection signal amplifier 42 into a digital signal.

The signal processing unit 44 is a logic circuit that detects a predetermined physical quantity entered to the light receiving unit 10 based on the output signal of the detection circuit 48. When a finger Fg contacts or approaches a detection surface, the signal processing unit 44 detects unevenness of the finger Fg or the surface of the palm based on a signal from the detection circuit 48. The signal processing unit 44 detects information on a living body based on a signal from the detection circuit 48. For example, information on a living body includes a blood vessel image, a pulse wave, a pulse, and a blood oxygen-saturation level of the finger Fg or the palm. The signal processing unit 44 calculates a signal ΔV of a difference between the first detection signal Vdet and the second detection signal Vdet-R.

The storage unit 45 temporarily stores the signal calculated by the signal processing unit 44. The storage unit 45 stores information of the first detection signal Vdet, the second detection signal Vdet-R, and the differential signal ΔV in the past. The storage unit 45 may be a RAM (Random Access Memory) or a register circuit, for example.

The coordinate extracting unit 46 is a logic circuit that obtains the detected coordinates of the unevenness of the finger Fg when the signal processing unit 44 detects contact or proximity of the finger Fg. The coordinate extracting unit 46 is a logical circuit that obtains the detected coordinates of the finger Fg or the blood vessel of the palm. The coordinate extracting unit 46 combines the first detected signals Vdet from the respective photodiodes 30 of the light receiving unit 10 so as to generate two-dimensional information indicating the unevenness on the surface of the finger Fg. The coordinate extracting unit 46 may output the first detection signal Vdet and the second detection signal Vdet-R as the sensor output Vo without calculating the detection coordinates.

Figure 3:
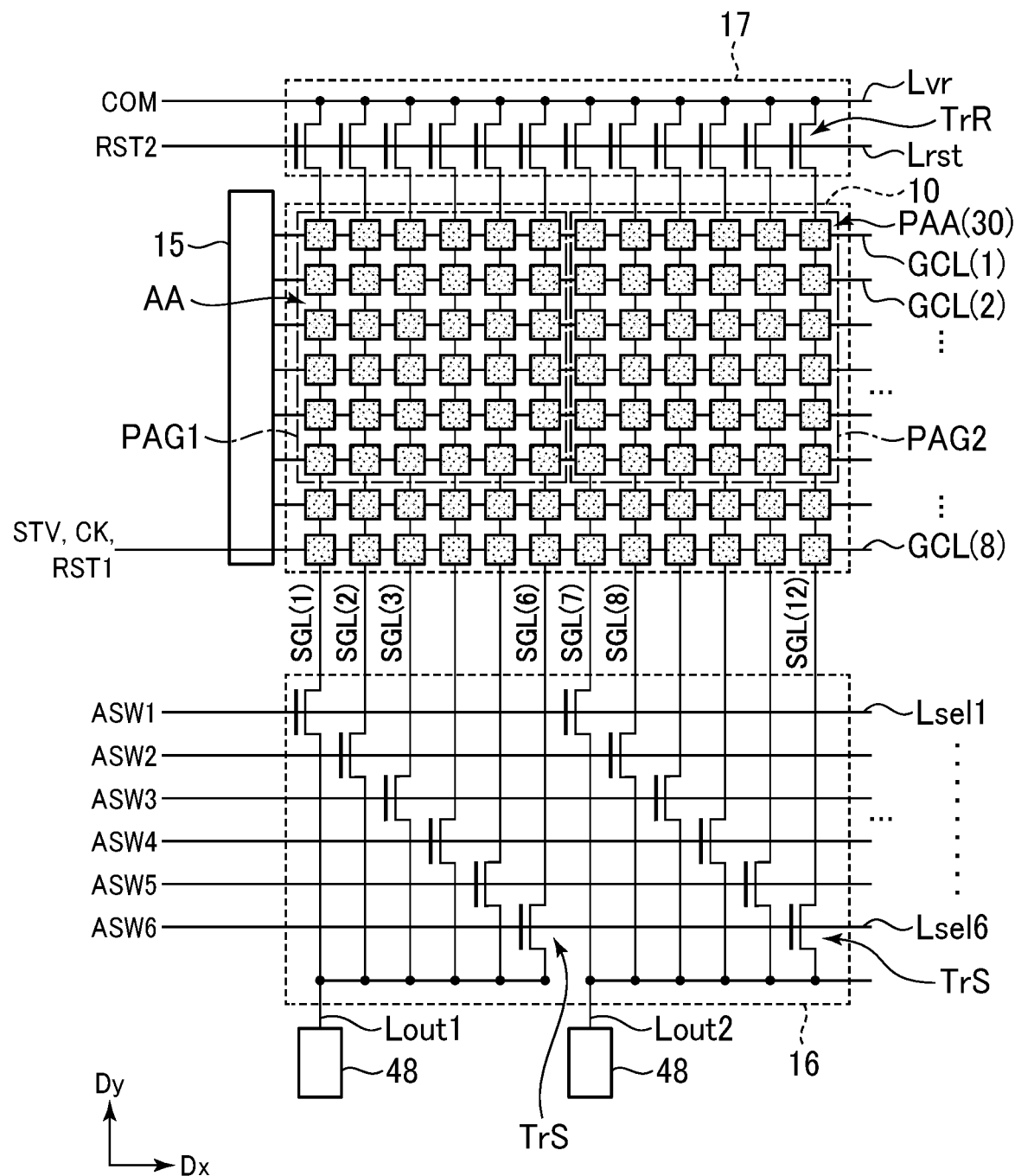
FIG. 3 is a circuit diagram of the optical sensor.
Figure 4:
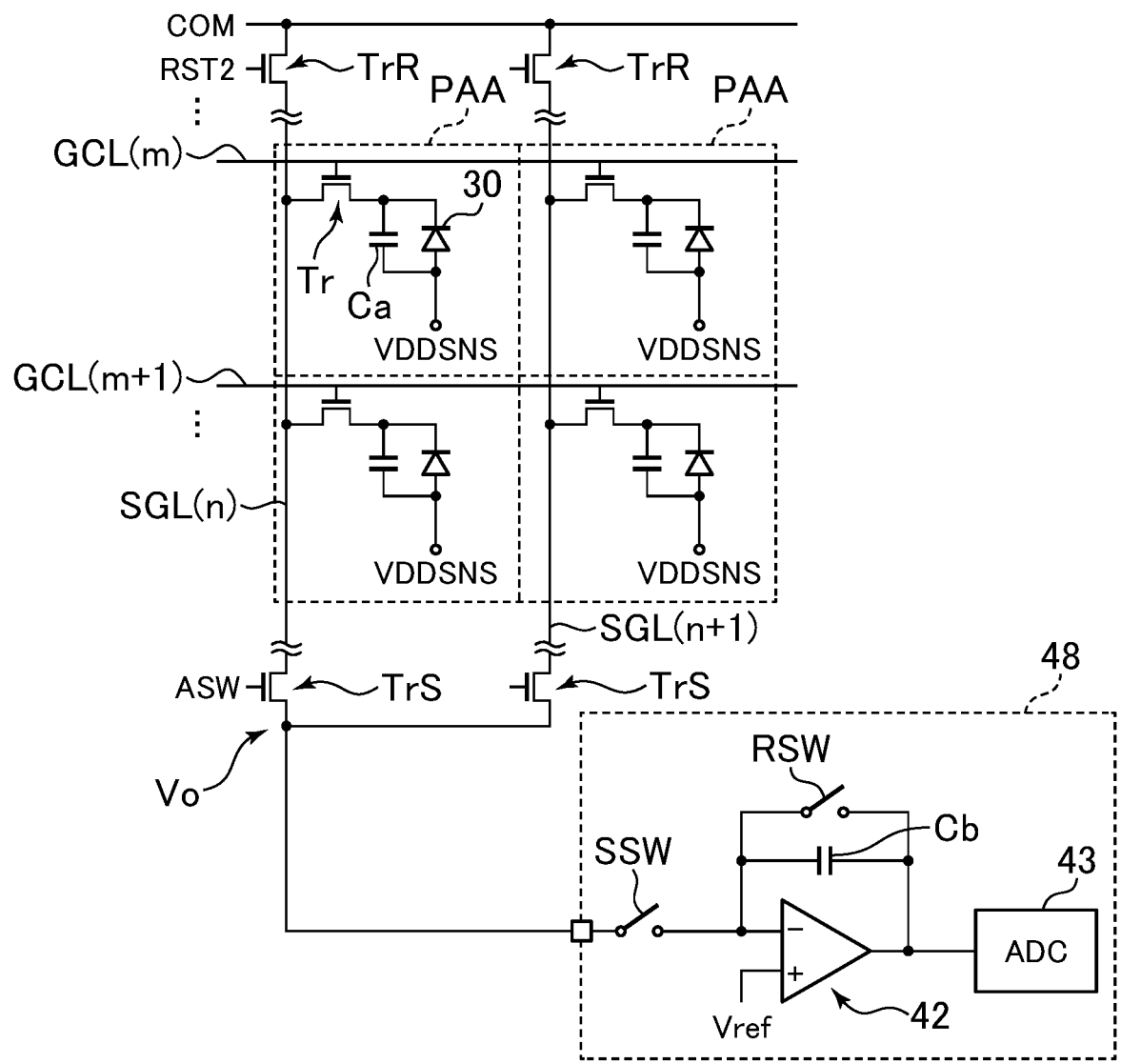
FIG. 4 is a circuit diagram of a portion of a detection area.

Next, examples of circuit configuration and operation of the optical sensor 1 will be described. FIG. 3 is a circuit diagram of the optical sensor 1. FIG. 4 is a circuit diagram of a portion of the detection area. FIG. 4 also shows the circuit configuration of the detection circuit 48.

As shown in FIG. 3, the light receiving unit 10 includes a plurality of partial detection areas PAA disposed in a matrix. The partial detection areas PAA respectively include the photodiodes 30.

The gate line GCL extends in the first direction Dx and is connected to the plurality of partial detection areas PAA disposed in the first direction Dx. Further, the plurality of gate lines GCL(1), GCL(2), . . . , GCL(8) are disposed in the second direction Dy and connected to the gate line drive circuit 15. In the following, the gate lines GCL(1), GCL(2), . . . , GCL(8) are simply referred to as gate lines GCL when they need not be described separately. In FIG. 3, eight gate lines GCL are shown for ease of explanation, but this is merely an example and M gate lines GCL (M is 8 or more, e.g., 256) may be disposed.

The signal line SGL extends in the second direction Dy and is connected to the photodiodes 30 of the partial detection areas PAA disposed in the second direction Dy. Further, the plurality of signal lines SGL (1), SGL (2), . . . , SGL(12) are disposed in the first direction Dx and connected to the signal line selecting circuit 16 and the reset circuit 17. In the following, the signal lines SGL (1), SGL (2), . . . , SGL(12) are simply referred to as signal lines SGL when they need not be described separately.

For simplicity, twelve signal lines SGL are illustrated, but this is merely an example and N signal lines SGL may be disposed (N is 12 or more, e.g., 252). The resolution of the sensor is 508 dpi (dot per inch), and the number of cells is 252×256, for example. In FIG. 3, the light receiving unit 10 is provided between the signal line selecting circuit 16 and the reset circuit 17. Without being limited to this, the signal line selecting circuit 16 and the reset circuit 17 may be respectively connected to the end portions of the signal lines SGL in the same direction.

The gate line drive circuit 15 receives control signals, such as a start signal STV, a clock signal CK, and a reset signal RST1, from the detection control unit 11. The gate line drive circuit 15 sequentially selects a plurality of gate lines GCL(1), GCL(2), . . . , GCL(8) in a time-division manner based on the control signals. The gate line drive circuit 15 supplies the gate drive Vgcl to the selected gate line GCL. In this manner, the gate drive signal Vgcl is supplied to a plurality of first switching elements Tr coupled to the gate line GCL, and selects the partial detection areas PAA, which are disposed in the first direction Dx, as detection targets.

The gate line drive circuit 15 may perform different driving for each mode of detecting a fingerprint and information about a plurality of different living bodies (e.g., pulse wave, pulse, blood vessel image, blood oxygen saturation). For example, the gate line drive circuit 15 may collectively drive a plurality of gate lines GCL.

Specifically, the gate line drive circuit 15 may simultaneously select a predetermined number of gate lines GCL among the gate lines GCL(1), GCL(2), . . . , GCL(8) based on the control signal. For example, the gate line drive circuit 15 simultaneously selects six gate lines GCL(1) to GCL(6) and supplies them with the gate driver Vgcl. The gate line drive circuit 15 supplies the gate drive signal Vgcl to the first switching elements Tr via the selected six gate lines GCL. In this manner, the group areas PAG1 and PAG2, which include the partial detection areas PAA disposed in the first direction Dx and the second direction Dy, are selected as detection targets. The gate line drive circuit 15 collectively drives a predetermined number of gate lines GCL and sequentially supplies the gate drive signals Vgcl to a predetermined number of units of the gate lines GCL. In the following, when positions of different group areas such as the group areas PAG1 and PAG2 are not distinguished from each other, each of the group areas will be called "group area PAG".

The signal line selecting circuit 16 includes a plurality of selection signal lines Lsel, output signal lines Lout, and second switching elements TrS. The second switching elements TrS are provided so as to correspond to the signal lines SGL. Six signal lines SGL(1), SGL(2), . . . , SGL(6) are coupled to a common output signal line Lout1. Six of the signal lines SGL(7), SGL(8), . . . , SGL(12) are coupled to a common output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are respectively coupled to the gates of the second switching elements TrS included in one of the signal line blocks. One of the selection signal lines Lsel is coupled to the gates of the second switching elements TrS in the signal line blocks.

Specifically, selection signal lines Lsel1, Lsel2, . . . , Lsel6 are coupled to the second switching elements TrS respectively corresponding to the signal lines SGL(1), SGL(2), . . . , SGL(6). The selection signal line Lsel1 is coupled to the second switching element TrS corresponding to the signal line SGL(1) and the second switching element TrS corresponding to the signal line SGL(7). The selection signal line Lsel2 is coupled to the second switching element TrS corresponding to the signal line SGL(2) and the second switching element TrS corresponding to the signal line SGL(8).

The detection control unit 11 sequentially supplies the selection signals ASW to the selection signal lines Lsel. With this operation, the signal line selecting circuit 16 sequentially selects, by the operations of the second switching elements TrS, the signal lines SGL in a time-division manner in one signal line block. The signal line selecting circuit 16 selects one signal line SGL for each of the plurality of signal line blocks. Such a configuration enables the optical sensor 1 to reduce the number of ICs (Integrated Circuit) including the detection circuit 48 or the number of terminals of ICs.

The signal line selecting circuit 16 may collectively couple more than one signal line SGL to the detection circuit 48. Specifically, the detection control unit 11 simultaneously supplies the selection signals ASW to the selection signal lines Lsel. With this operation, the signal line selecting circuit 16 selects, by the operations of the second switching elements TrS, the signal lines SGL (e.g. six signal lines SGL) in one of the signal line blocks, and couples the signal lines SGL to the detection circuit 48. As a result, signals detected in each group area PAG are output to the detection circuit 48. In this case, signals from the partial detection areas PAA (photodiodes 30) in each group area PAG are put together and output to the detection circuit 48.

The gate line drive circuit 15 and the signal line selecting circuit 16 operate to perform detection for each group area PAG, and the intensity of the first detection signal Vdet obtained by one time of detection thereby increases. This improves sensor sensitivity. Further, time required for the detection can be reduced. As such, the optical sensor 1 can repeatedly perform the detection in a short time, thereby improving a signal-to-noise (S/N) ratio and accurately detecting a change in the biological information with time, such as the pulse wave.

The reset circuit 17 includes a reference signal line Lvr, a reset signal line Lrst, and third switching elements TrR. The third switching elements TrR are provided so as to correspond to the signal lines SGL. The reference signal line Lvr is coupled to either the sources or the drains of the third switching elements TrR. The reset signal line Lrst is coupled to the gates of the third switching elements TrR.

The detection control unit 11 supplies a reset signal RST2 to the reset signal line Lrst. This turns the third switching elements TrR on, and the signal lines SGL are electrically connected to the reference signal line Lvr. The power supply circuit 28 supplies a reference signal COM to the reference signal line Lvr. The reference signal COM is thus supplied to the additional capacitance Cad (see FIG. 4) included in the partial detection areas PAA.

As shown in FIG. 4, the partial detection area PAA includes a photodiode 30, an additional capacitance Cad, and a first switching element Tr. FIG. 4 shows two gate lines GCL(m) and GCL(m+1) disposed in the second direction Dy among the plurality of gate lines GCL. Further, two signal lines SGL(n) and SGL(n+1) disposed in the first direction Dx are shown among the plurality of signal lines SGL. The partial detection area PAA is surrounded by the gate line GCL and the signal line SGL. The first switching element Tr is provided to correspond to the photodiode 30. The first switching element Tr is formed of a thin film transistor TFT (see FIG. 5), and in this example, is formed of an n-channel MOS (metal oxide semiconductor) type TFT (thin film transistor).

The gates of the first switching elements Tr belonging to the partial detection areas PAA disposed in the first direction Dx are coupled to the gate line GCL. The sources of the first switching elements Tr belonging to the partial detection areas PAA disposed in the second direction Dy are coupled to the signal line SGL. The drain of the first switching element Tr is coupled to the cathode of the photodiode 30 and the additional capacitance Cad.

The power supply circuit 28 supplies a sensor power supply signal VDDSNS to the anode of the photodiode 30. The power supply circuit 28 supplies the signal line SGL and the additional capacitance Cad with the reference signal COM, which serves as an initial potential of the signal line SGL and the additional capacitance Cad.

When the partial detection area PAA is irradiated with light, a current corresponding to the amount of the light flows through the photodiode 30, and an electrical charge is thereby stored in the additional capacitance Cad. When the first switching element Tr is turned on, a current corresponding to the electrical charge stored in the additional capacitance Cad flows through the signal line SGL. The signal line SGL is coupled to the detection circuit 48 through a corresponding one of the second switching elements TrS of the signal line selecting circuit 16. With this configuration, the optical sensor 1 can detect a signal corresponding to the amount of the light irradiating the photodiode 30 in each of the partial detection areas PAA or each of the group areas PAG.

The detection signal amplifier 42 of the detection circuit 48 converts a variation of a current supplied from the signal lines SGL into a variation of a voltage, and amplifies the result. A reference voltage Vref having a fixed potential is supplied to a non-inverting input portion (+) of the detection signal amplifier 42. The signal line SGL is coupled to an inverting-input terminal (−) when the output switch SSW is ON. The same signal as the reference signal COM is supplied as the reference voltage Vref. The detection signal amplifier 42 includes a capacitive element Cb and a reset switch RSW. When the read-out of the signals of one row is completed, the reset switch RSW is turned on, and the electrical charges of the capacitor Cb are reset.

Figure 5:
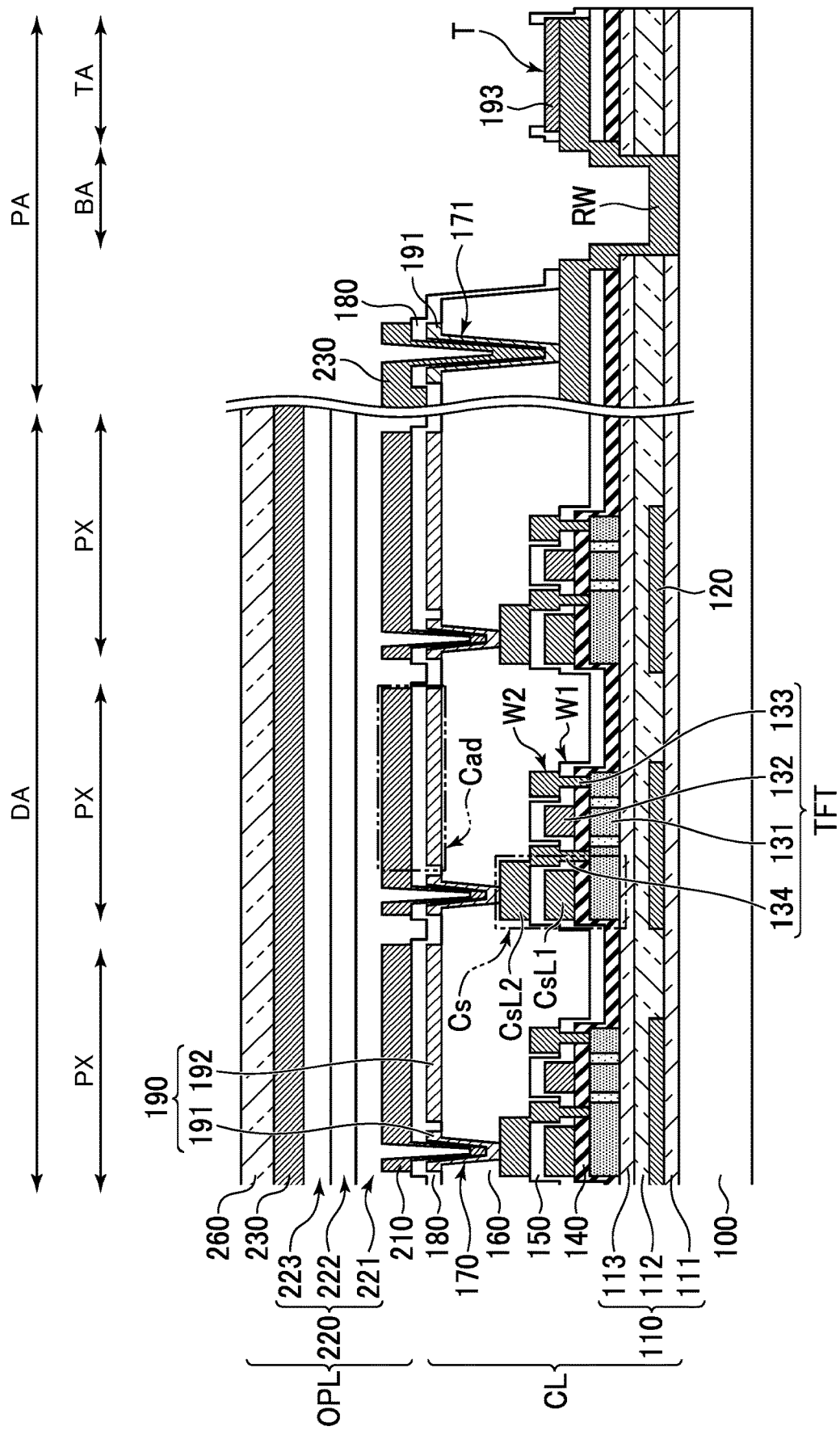
FIG. 5 is a partial sectional view of the optical sensor taken along V-V shown in FIG. 1.

Next, a cross-sectional configuration of the optical sensor 1 will be described. FIG. 5 is a partial sectional view of the optical sensor 1 taken along V-V shown in FIG. 1 according to the first embodiment. In FIG. 5, a microlens array 600 (described later) is omitted. Further, in FIG. 5, a part of the detection area DA and a part of the frame area PA are shown in a cross-sectional view. As described above, the detection area DA includes a plurality of pixels PX, and the frame area PA includes the bending area BA and the terminal area TA. Each pixel PX includes a corresponding one of the lower electrodes 210 and a corresponding one of the thin film transistors TFT. A circuit layer CL includes films including from a barrier inorganic film 110 to an inorganic insulating film 180, and an organic photoelectric conversion layer OPL includes electrodes including from a lower electrode 210 to an upper electrode 230.

FIG. 5 shows the cut surface in the second direction Dy, but the same cross-sectional structure as in FIG. 4 is observed when the detection area DA is cut in the first direction Dy. In FIG. 5, hatching of some layers is omitted for clarity of the cross-sectional structure.

In the following, the lamination structure including from the resin substrate 100 to the sealing film 260 will be described in order from the lower layer. First, the circuit layer CL provided on the resin substrate 100 will be described.

A barrier inorganic film 110 is laminated on the resin substrate 100. The resin substrate 100 is made of polyimide. If the substrate has sufficient flexibility as the sheet-type optical sensor, the resin substrate 100 may be formed of other resin materials. The barrier inorganic film 110 has a three-layer structure of a first inorganic film 111 (e.g., silicon oxide film), a second inorganic film 112 (e.g., silicon nitride film), and a third inorganic film 113 (e.g., silicon oxide film). The first inorganic film 111 is provided to improve the adhesion to the base material, the second inorganic film 112 is provided to block moisture and impurities from the outside, and the third inorganic film 113 is provided to prevent hydrogen atoms contained in the second inorganic film 112 from diffusing to the semiconductor layer 131, but the structure is not limited to these. The structure may include more layers, or may be formed of a single layer or double layers.

An additional film 120 may be formed in accordance with a portion where the thin film transistor TFT to be described later is formed. The additional film 120 prevents light penetrating from the back surface of the channel of the thin film transistor TFT so as to reduce a change in the characteristics of the thin film transistor TFT, or is made of conductive material and supplied with a predetermined potential, thereby providing a back-gate effect to the thin film transistor TFT. Here, after the first inorganic film 111 is formed, the additional film 120 is formed in an island shape in accordance with a portion where the thin film transistor TFT is formed, and then the second inorganic film 112 and the third inorganic film 113 are laminated to encapsulate the additional film 120 in the barrier inorganic film 110. However, the present invention is not limited thereto, and the additional film 120 may be first formed on the resin substrate 100 and then the barrier inorganic film 110 may be formed.

A thin film transistor TFT is formed on the barrier inorganic film 110 for each pixel PX. The thin film transistor TFT includes a semiconductor layer 131, a gate electrode 132, a source electrode 133, and a drain electrode 134. In an example of a polysilicon thin film transistor, only a Nch transistor is illustrated here, although a Pch transistor may be simultaneously formed. The semiconductor layer 131 of the thin film transistor TFT includes a low-concentration impurity area or an intrinsic semiconductor area between the channel region and the source/drain region. In each pixel PX, the gate electrode 132 is where the gate line GCL is electrically coupled to the semiconductor layer 131. Similarly, in each pixel PX, the source electrode 133 is where the signal line SGL is electrically coupled to the semiconductor layer 131.

The gate insulating film 140 is provided between the semiconductor layer 131 and the gate electrode 132. Here, a silicon oxide film is used as the gate insulating film 140. The gate electrode 132 is a part of a first wiring layer W1 formed of MoW. The first wiring layer W1 includes a first storage capacitor line CsL1 in addition to the gate electrode 132. A portion of the storage capacitor Cs is formed between the first storage capacitor line CsL1 and the semiconductor layer 131 (source/drain regions) via the gate insulating film 140.

An interlayer insulating film 150 is formed on the gate electrode 132. The interlayer insulating film 150 has a structure in which a silicon nitride film and a silicon oxide film are laminated. In the portion corresponding to the bending area BA, the barrier inorganic film 110 to the interlayer insulating film 150 are removed by patterning. In the position corresponding to the bending area BA, the polyimide forming the resin substrate 100 is exposed. When the barrier inorganic film 110 is removed by patterning, the surface of the polyimide may be partially eroded, resulting in film reduction.

A wiring pattern is formed under a stepped portion at the end portion of the interlayer insulating film 150 and a stepped portion at the end portion of the barrier inorganic film 110. A routing wire RW passes over the routing pattern when crossing the stepped portion. For example, a gate electrode 132 is disposed between the interlayer insulating film 150 and the barrier inorganic film 110, and an additional film 120 is disposed between the barrier inorganic film 110 and the resin substrate 100. As such, a wiring pattern is formed using these layers.

A second wiring layer W2, including portions for a source electrode 133, a drain electrode 134, and a routing wire RW, is on the interlayer insulating film 150. A three-layer laminate structure of titanium, aluminum, and titanium is employed here. A first storage capacitor line CsL1 (a part of the first wiring layer W1) and a second storage capacitor line CsL2 (a part of the second wiring layer W2) form another part of the storage capacitor Cs through the interlayer insulating film 150. The routing wire RW extends to the terminal area TA through the bending area BA, and forms a terminal portion T to which the flexible printed circuit board 300 is connected.

The routing wire RW is formed so as to reach the terminal portion T across the bending area BA, and thus passes over the stepped portions of the interlayer insulating film 150 and the barrier inorganic film 110. As described above, the wiring pattern formed by the additional film 120, for example, is formed in the stepped portion. As such, even if the routing wire RW is cut at a recess of the stepped portion, electric connection can be maintained by contacting the wiring pattern.

A flattening film 160 is provided so as to cover the source electrode 133, the drain electrode 134, and the interlayer insulating film 150. The flattening film 160 is formed of a resin, such as a photosensitive acrylic, which is superior in surface flatness to an inorganic insulating material formed by CVD (Chemical Vapor Deposition), for example. The flattening film 160 is removed in a pixel contact portion 170, an upper electrode contact portion 171, the bending area BA, and the terminal area TA.

A transparent conductive film 190 made of indium-tin-oxide (ITO) is formed on the flattening film 160 for each pixel PX. The transparent conductive film 190 includes a first transparent conductive film 191 and a second transparent conductive film 192, which are separated from each other.

The first transparent conductive film 191 is electrically connected to the second wiring layer W2, which is exposed in the pixel contact portion 170 due to the removal of the flattening film 160. The second transparent conductive film 192 is provided below a lower electrode 210 (further below the inorganic insulating film 180), which will be described later, next to the pixel contact portion 170. An inorganic insulating film 180 (silicon nitride film) is disposed on the transparent conductive film 190 and the flattening film 160 so as to cover the first transparent conductive film 191 except for the opening of the pixel contact portion 170.

The second transparent conductive film 192, the inorganic insulating film 180, and the lower electrode 210 overlap one another in a plan view, and form an additional capacitance Cad.

The transparent conductive film 190 may also be formed on the surface of the terminal portion T to serve as a third transparent conductive film 193. The third transparent conductive film 193 formed on the surface of the terminal portion T may be provided for the purpose of protecting the exposed wiring from being damaged in the process subsequent to forming the third transparent conductive film 193.

The lower electrode 210 is provided for each pixel PX on the inorganic insulating film 180 so as to be electrically connected to the drain electrode 134 via the opening of the inorganic insulating film 180 in the pixel contact portion 170. The lower electrode 210 is formed as a reflective electrode and has a three-layer stack of an indium zinc oxide film, an Ag film, and an indium zinc oxide film. Here, an indium tin oxide film may be used instead of the indium zinc oxide film. The lower electrode 210 extends laterally from the pixel contact portion 170 and extends above the thin film transistor TFT.

An organic material layer 220 is provided on the lower electrode 210. The organic material layer 220 includes, in order from the bottom, a lower carrier transport layer 221, an organic light-receiving layer 222, and an upper carrier transport layer 223. When the surface irradiation type structure is employed, the lower carrier transport layer 221 is an electron transport layer, and the upper carrier transport layer 223 is an electron transport layer. When the back surface irradiation type structure is employed, the lower carrier transport layer 221 is an electron transport layer and the upper carrier transport layer 223 is a hole transport layer. The organic light-receiving layer 222 may be formed by vapor deposition or by coating on a solvent dispersion. Here, the organic light-receiving layer 222 is formed on the entire surface covering the detection area DA, but the present invention is not limited to this.

On the organic layers 220, upper electrodes 230 are commonly formed in the respective pixel PX. In a case where the surface irradiation type structure is employed, the upper electrode 230 needs to be transparent. Here, after PEDOT:PSS is formed on the surface in contact with the organic material layers 220, a metallic material such as Ag, Al is used to form the upper electrode 230 as a thin film through which the incoming light is transmitted. The upper electrode 230 is formed over the organic material layer 220 provided in the detection area DA to the upper electrode contact portion 171 provided in the frame area PA. The upper electrode 230 is electrically connected to the routing wiring RW of the second wiring layers W2 in the upper electrode contact portion 171, and eventually drawn to the terminal portion T.

A sealing film 260 is formed on the upper electrode 230. One of the functions of the sealing film 260 is protecting the organic material layer 220 from moisture entering from the outside, and is required to have a high gas barrier property. Here, the sealing film 260 has a laminate structure including a silicon nitride film, and includes a silicon nitride film, an organic resin, and a silicon nitride film. A silicon oxide film or an amorphous silicon layer may be provided between the silicon nitride film and the organic resin to improve adhesion. In this regard, such a film is provided on the light-receiving surface side, and thus, it is preferable that the materials do not absorb or otherwise act on light of the wavelength to be detected.

Figure 6:
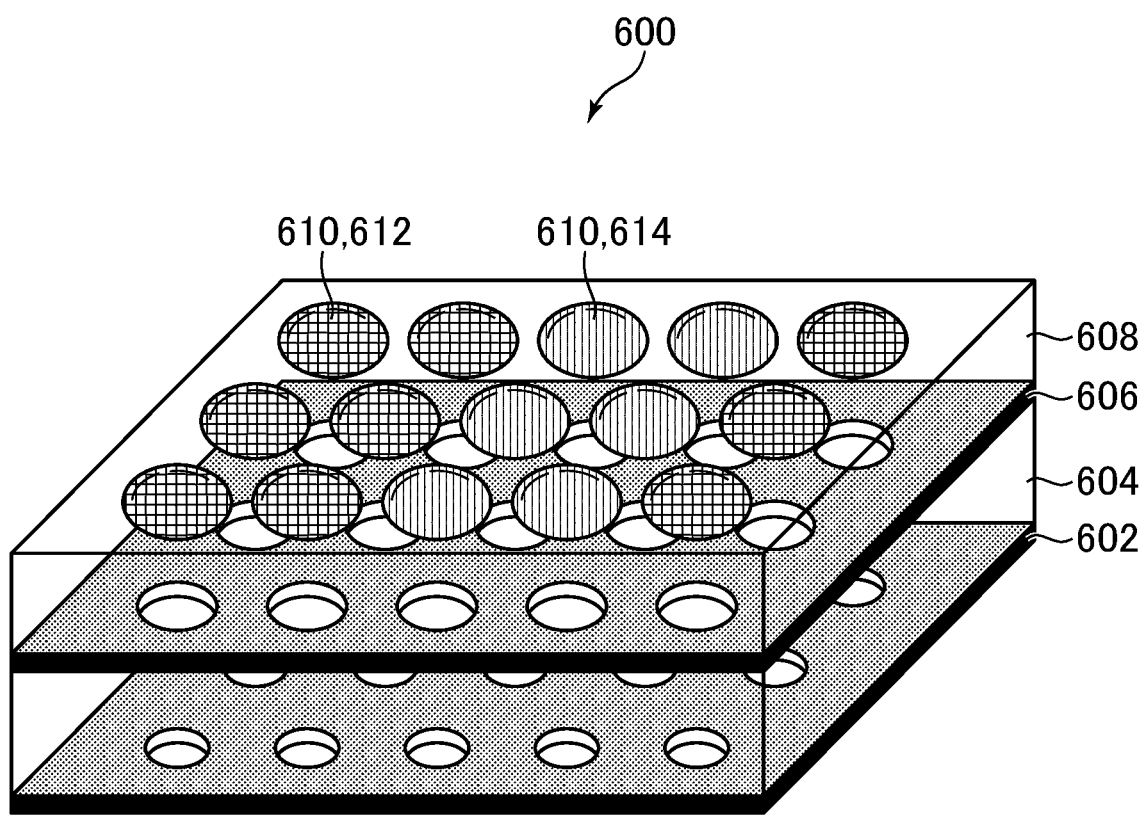
FIG. 6 is an overhead view of a microlens array according to a first embodiment.
Figure 7A:
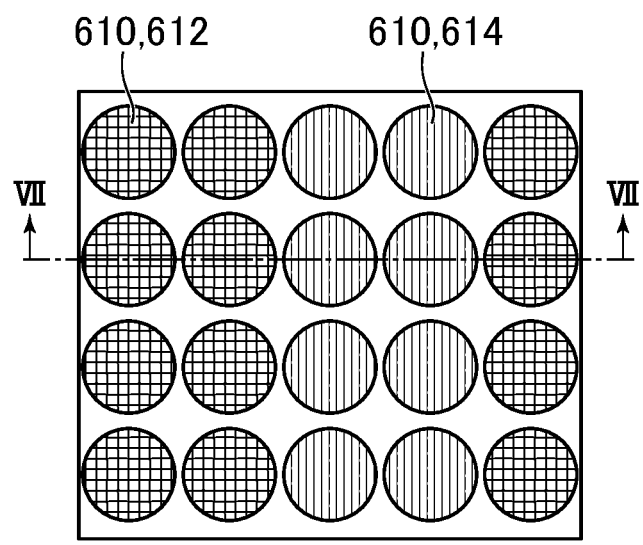
FIGS. 7A to 7C are a plan view and a cross-sectional view of the optical sensor and a diagram explaining transmittance, respectively.
Figure 7B:
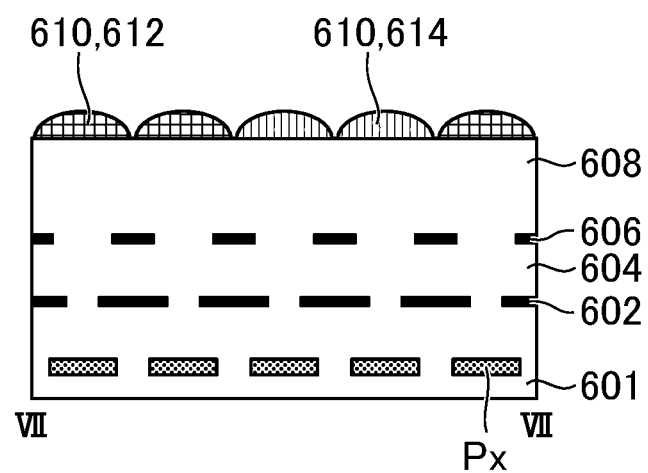
Figure 7C:
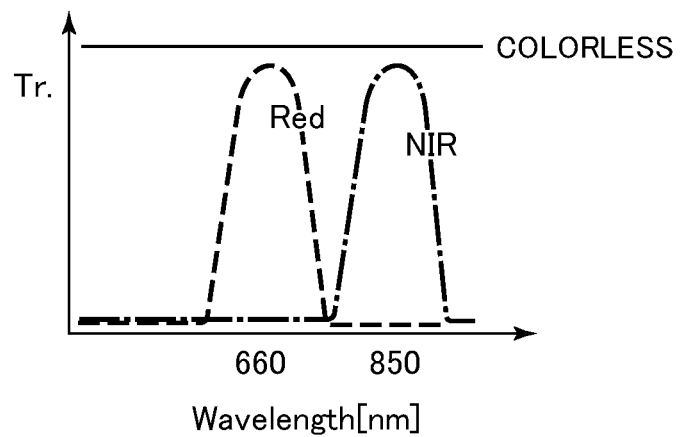

Next, the microlens array 600 according to the first embodiment will be described referring to FIGS. 6 to 7C. FIG. 6 is an overhead view of the microlens array 600. FIG. 7A is a plan view of the optical sensor 1 for describing the wavelength of transmitted light. FIG. 7B is a schematic diagram showing the VII-VII cross-section in FIG. 7A. FIG. 7C is a diagram for illustrating transmittance. In FIG. 7C, "Red" indicates the transmittance of a first wavelength selection unit 612 of the microlens array 600, "NIR" indicates the transmittance of a second wavelength selection unit 614 of the microlens array 600, and "colorless" indicates the transmittance of a first transmission layer 604 and a second transmission layer 608 of the microlens array 600.

FIG. 7A shows only a part of the optical sensor 1 (an area of four rows and five columns), and indicates the wave length of the light transmitted through the microlens array 600 by hatching. FIG. 7B omits the layers shown in FIG. 5 so that the positional relationship between the microlens 610, the pinhole, and the pixel PX is recognized, and shows only pixels PX of the sensor unit 601.

The optical sensor 1 includes the microlens array 600 and the sensor unit 601 that includes from the resin substrate 100 to the sealing film 260 shown in FIG. 5. The microlens array 600 includes a first pinhole layer 602, a first transmission layer 604, a second pinhole layer 606, a second transmission layer 608, and a plurality of microlenses 610. The microlens array 600 and the sensor unit 601 are bonded to each other by a transparent adhesive layer (not shown), such as an optical clear adhesive (OCA). Further, as described later in a manufacturing method, a transparent substrate 1100 or a resin layer may be disposed between the second transmission layer 608 and the microlenses 610.

The pinholes are provided at positions respectively overlapping the pixels PX in the first pinhole layer 602. Specifically, for example, the first pinhole layer 602 is formed of a material that blocks visible light and infrared rays. The first pinhole layer 602 has a thickness of 2 micrometers, for example, and pinholes at positions overlapping with the pixels PX in a plan view. The diameter of the pinhole provided in the first pinhole layer 602 is 5 μm, for example.

The first transmission layer 604 is disposed on the first pinhole layer 602 and transmits light. Specifically, for example, the first transmission layer 604 is formed of a material that transmits the entire wavelength range of visible light and infrared light on the first pinhole layer 602. The first transmission layer 604 is also filled in the pinholes of the first pinhole layer 602 and has a thickness of 20 μm, for example.

The pinholes are provided at positions overlapping the pixels PX in the second pinhole layer 606, which is disposed on the first transmission layer 604. Specifically, for example, the second pinhole layer 606 is formed of a material that shields visible light and infrared rays. The second pinhole layers 606 has a thickness of 2 micrometers, for example, and pinholes at positions overlapping with the pixels PX in a plan view. The diameter of the pinhole provided in the second pinhole layer 606 is 10 μm, for example.

The second transmission layer 608 is disposed on the second pinhole layer 606 and transmits light. Specifically, for example, the second transmission layer 608 is formed of a material that transmits the entire wavelength range of visible light and infrared light on the second pinhole layer 606. The second transmission layer 608 is also filled in the pinholes of the second pinhole layer 606 and has a thickness of 30 μm, for example.

The microlenses 610 are disposed on the second transmission layers 608 at the positions respectively overlapping the pixels PX. Specifically, for example, the microlenses 610 have a flat spherical shape, and condense incident visible light and infrared light. The condensed light passes through the second transmission layer 608, the pinholes of the second pinhole layer 606, the first transmission layer 604, and the pinholes of the first pinhole layer 602 in this order, and is irradiated onto the pixels PX.

The microlenses 610 include a plurality of microlenses 610 belonging to a first group and a plurality of microlenses 610 belonging to a second group. In the first embodiment, the first group and the second group are disposed in a plane. Specifically, for example, as shown in FIGS. 6 and 7A, the microlenses 610 belonging to the first group are disposed toward the second direction Dy. Similarly, the microlenses 610 belonging to the second group are disposed toward the second direction Dy. The microlenses 610 and 612 belonging to the first group and the microlenses 610 belonging to the second group are alternately disposed in two rows toward the first direction Dx.

In the present disclosure, either of the microlenses 610 belonging to the first group or the microlenses 610 belonging to the second group are the first wavelength selection unit 612 that transmits light of the first wavelength. At least one of the other of the microlenses 610 belonging to the first group and the microlenses 610 belonging to the second group, the first transmission layer 604, and the second transmission layer 608 is the second wavelength selection unit 614 that transmits light of the second wavelength.

In the first embodiment, the microlenses 610 belonging to the first group are the first wavelength selection unit 612, and the microlenses 610 belonging to the second group are the second wavelength selection unit 614. Specifically, for example, the microlenses 610 belonging to the first group are the first wavelength selection unit 612 that transmits only light of the first wavelength (e.g., 640 nm to 680 nm centered on 660 nm). The microlenses 610 belonging to the second group are the second wavelength selection unit 614 that transmits only light of the second wavelength (e.g., 830 nm to 870 nm centered on 850 nm). In FIG. 7C, "Red" indicates the transmittance of the first wavelength selection unit 612, "NIR" indicates the transmittance of the second wavelength selection unit 614, and "colorless" indicates the transmittance of the first transmission layer 604 and the second transmission layer 608.

As described above, the microlenses 610 condense the incident light, and the condensed light passes through the pinholes of the first pinhole layer 602 and the pinholes of the second pinhole layer 606. That is, among the light incident on the partial detection area PAA of the pixel PX, the component of light incident from the oblique direction is blocked and only the component of light incident from the vertical direction reaches the partial detection area PAA. As such, the microlens array 600 functions as a collimator.

Only the light of the first wavelength (e.g., 640 nm to 680 nm centered on 660 nm) reaches the partial detection area PAA in the area overlapping with the first wavelength selection unit 612 in a plan view. Only the light of the second wavelength (e.g., 830 nm from 870 nm centered on 850 nm) reaches the partial detection area PAA in the area overlapping with the second wavelength selection unit 614 in a plan view. With this configuration, the optical sensor 1 according to the first embodiment can acquire a plurality of types of information by a plurality of wavelengths.

As described above, the optical sensor 1 including the first wavelength selection unit 612 and the second wavelength selection unit 614 can acquire a plurality of types of information by a plurality of wavelengths in a short time. In the conventional technique, it is also possible to acquire a plurality of types of information on a measurement target by sequentially irradiating a measurement target with light in a plurality of wavelengths at intervals and sensing reflected light and transmitted light from the measurement target. In this regard, however, the present disclosure provides acquiring a plurality of types of information by a plurality of wavelengths in a short time.

Figure 8A:
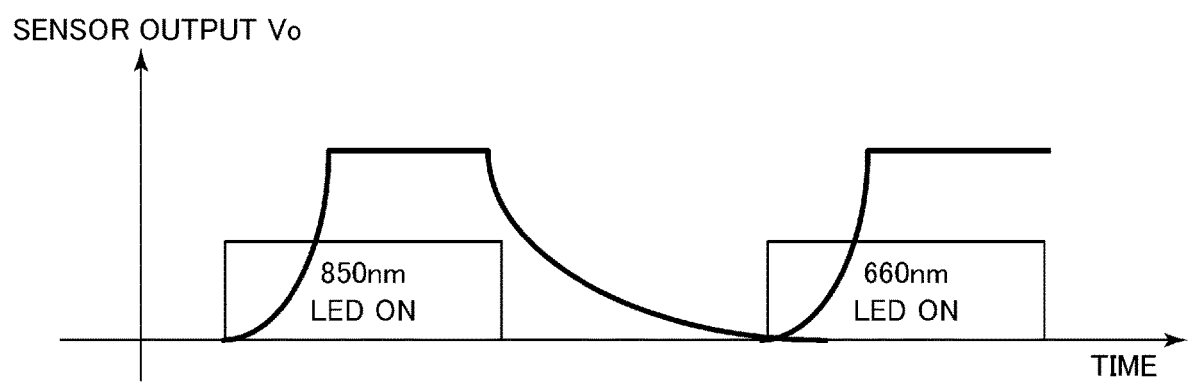
FIGS. 8A and 8B are diagrams illustrating a time change of sensor output.
Figure 8B:
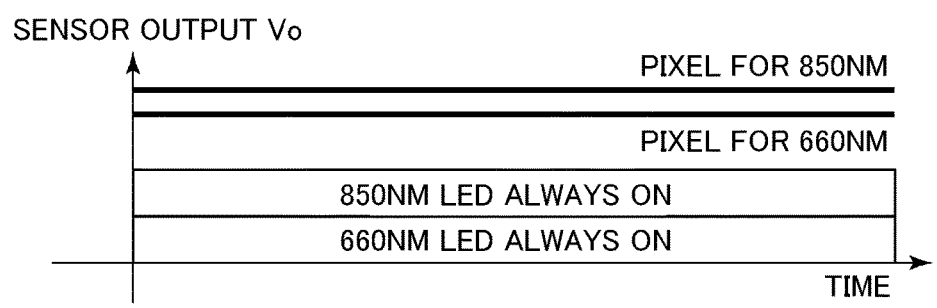

FIG. 8A is a diagram illustrating a time change of the sensor output in the conventional technique (time division), and FIG. 8B is a diagram illustrating a time change of the sensor output in the present disclosure. In FIGS. 8A and 8B, the vertical axis represents the sensor output Vo, and the horizontal axis represents the time. Assume that the coordinate extracting unit 46 outputs the first detection signal Vdet as the sensor output Vo.

As shown in FIG. 8A, according to the conventional technique, 850 nm light-emitting LED and 660 nm light-emitting LED are alternately turned on. The sensor power Vo begins to increase as the LED is turned ON and then increases to a constant voltage depending on the amount of light in LED and then stabilizes. Thereafter, the sensor output Vo from all the partial detection areas PAA are acquired once (or a predetermined number of times). Subsequently, the power supply circuit 28 turns the LED off when the reference signal COM is supplied to the additional capacitance Cad (see FIG. 4) included in the partial detection areas PAA.

When the LED is turned off, the sensor output Vo gradually decreases and is returned back to the initial output voltage value (e.g., 0V) after a certain period of time. It is necessary to avoid mixing sensor outputs Vo of 850 nm light and 660 nm light so as to obtain a plurality of types of information. As such, a certain period of time is required after the 850 nm light-emitting LED is turned off in order to turn the 660 nm light emitting LED on. Similarly, a certain period of time is required after the 660 nm light-emitting LED is turned off in order to turn the 850 nm light-emitting LED on. Accordingly, switching of the LED is time-consuming in the conventional technique.

On the other hand, as shown in FIG. 8B, the present disclosure makes it possible to acquire a plurality of types of information based on the sensor output Vo of the pixel PX corresponding to the first wavelength selection unit 612 and the sensor output Vo of the pixel PX corresponding to the second wavelength selection unit 614 even when both the 660 nm light-emitting LED and 850 nm light-emitting LED are turned on at all times. Accordingly, it is possible to improve the detection accuracy per time.

Further, the LED that emits both 660 nm light and 850 nm light (e.g., a white LED) eliminates the need for providing LEDs that emit light of different wavelengths.

In the above description, the case has been described as an example in which the first wavelength is shorter than the second wavelength, the first wavelength is red light, and the second wavelength is infrared light, although the bands of the first wavelength and the second wavelength may be appropriately set according to the use of the optical sensor 1.

Further, in the above description, the case has been described in which a combination of one microlens 610, one pinhole of the first pinhole layer 602, and one pinhole of the second pinhole layer 606 (hereinafter referred to as a set of microlenses 610 etc.) correspond to one pixel PX, but the present invention is not limited thereto. For example, a set of microlenses 610 may correspond to four pixels PX of two rows and two columns. Further, four sets of microlenses 610 of two rows and two columns may correspond to one pixel PX.

[First Modification]

Figure 9A:
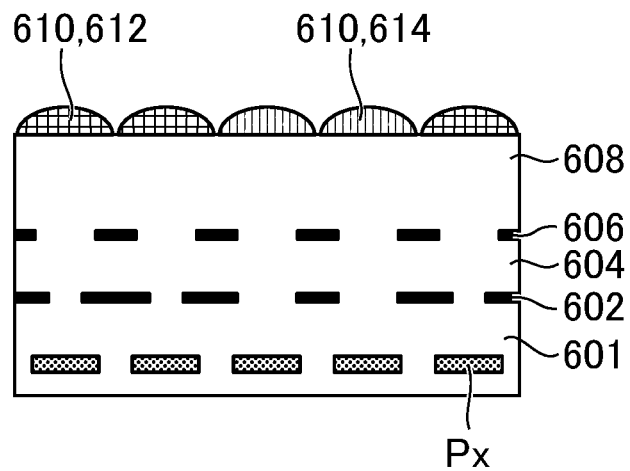
FIGS. 9A to 9C are cross-sectional views of the optical sensor according to first to third modifications.

FIG. 9A is a cross-sectional view of an optical sensor 1 according to the first modification of the first embodiment and corresponds to FIG. 7B of the first embodiment. Descriptions of the components similar to those of the first embodiment will be omitted.

In the first modification, the pinholes of the first pinhole layer 602 provided at positions corresponding to the microlenses 610 belonging to the first group have a smaller diameter than the pinholes of the first pinhole layer 602 provided at positions corresponding to the microlenses 610 belonging to the second group. As such, light incident at a higher incident angle to the surface of the optical sensor 1 reaches the pixels PX provided at the positions corresponding to the microlenses 610 belonging to the first group than the pixels PX provided at the positions corresponding to the microlenses 610 belonging to the second group. That is, the set of microlenses 610 belonging to the first group have higher collimating performance than the set of microlenses 610 belonging to the second group, while having lower transmittance.

Typically, the fingerprint authentication and the vein authentication differ in the form of subjects, and thus, the required resolution differs. For example, the resolution required for fingerprint authentication is 500 dpi. The resolution required for vein authentication may be lower than this, because the vein is thicker than the fingerprint. The transmittance of a set of microlenses 610 increases as the collimation performance decreases. As such, it is preferable that the collimator for capturing the fingerprint is designed to have high performance, and the collimator for capturing the vein, which has large attenuation of light amount, is designed to have low performance.

According to the first modification, the set of microlenses 610 belonging to the first group can have higher collimating performance than the set of microlenses 610 belonging to the second group. As such, the first modification is most suitable when the fingerprint authentication and the vein authentication are simultaneously performed, because in the first modification, the first wavelength is set to be shorter than the second wavelength, the set of microlenses 610 belonging to the first group are used for fingerprint authentication, and the set of microlenses 610 belonging to the first group are used for vein authentication.

[Second Modification]

Figure 9B:
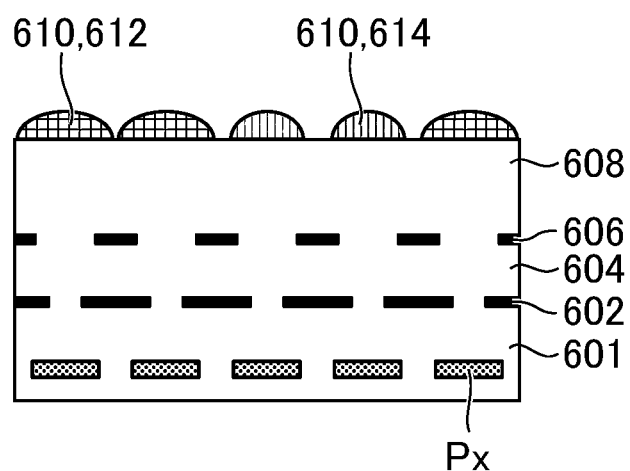

FIG. 9B is a cross-sectional view of an optical sensor 1 according to the second modification of the first embodiment and corresponds to FIG. 7B of the first embodiment. Descriptions of the components similar to those of the first embodiment will be omitted.

In the first modification, the microlenses 610 belonging to the first group have a larger diameter and the same height compared to the microlenses 610 belonging to the second group. According to the second modification, light incident at a higher incident angle to the surface of the optical sensor 1 reaches the pixels PX provided at the positions corresponding to the microlenses 610 belonging to the first group than the pixels PX provided at the positions corresponding to the microlenses 610 belonging to the second group. As such, similarly to the first modification, the second modification is most suitable when the fingerprint authentication and the vein authentication are simultaneously performed, because in the second modification, the first wavelength is set to be shorter than the second wavelength, the set of microlenses 610 belonging to the first group are used for fingerprint authentication, and the set of microlenses 610 belonging to the first group are used for vein authentication.

[Third Modification]

Figure 9C:
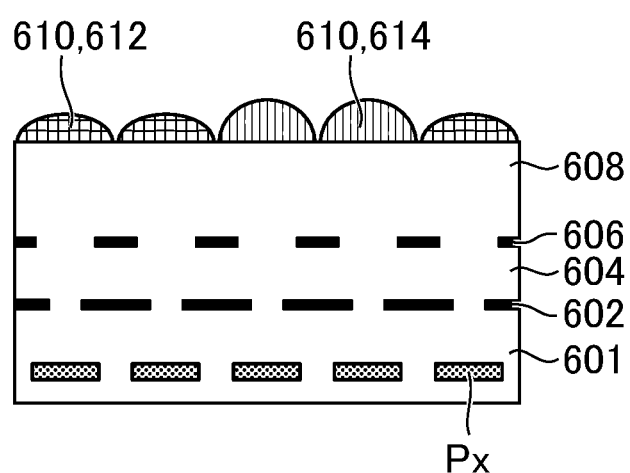

FIG. 9C is a cross-sectional view of an optical sensor 1 according to the third modification of the first embodiment and corresponds to FIG. 7B of the first embodiment. Descriptions of the components similar to those of the first embodiment will be omitted.

In the third modification, the microlenses 610 belonging to the first group are lower in height and have the same diameter compared to the microlenses 610 belonging to the second group. According to the third modification, light incident at a higher incident angle to the surface of the optical sensor 1 reaches the pixels PX provided at the positions corresponding to the microlenses 610 belonging to the first group than the pixels PX provided at the positions corresponding to the microlenses 610 belonging to the second group. As such, similarly to the first modification, the third modification is most suitable when the fingerprint authentication and the vein authentication are simultaneously performed, because in the third modification, the first wavelength is set to be shorter than the second wavelength, the set of microlenses 610 belonging to the first group are used for fingerprint authentication, and the set of microlenses 610 belonging to the first group are used for vein authentication. The configurations of the first to third modifications may be applied in combination.

[Fourth Modification]

Figure 10A:
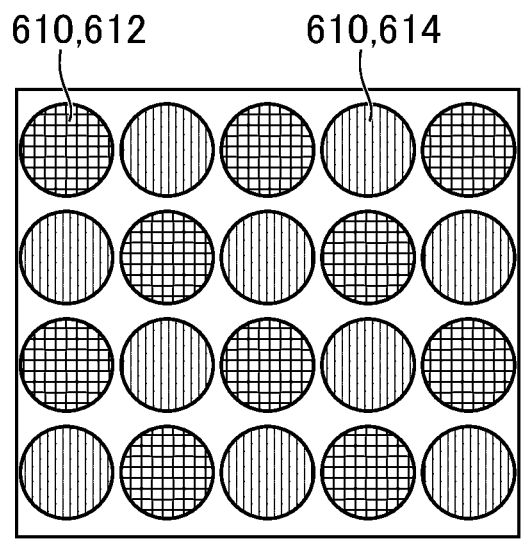
FIGS. 10A and 10B are plan views of the optical sensor according to fourth and fifth modifications.

FIG. 10A is a plan view of an optical sensor 1 according to the fourth modification of the first embodiment and corresponds to FIG. 7A of the first embodiment. Descriptions of the components similar to those of the first embodiment will be omitted.

In the fourth modification, the microlenses 610 belonging to the second group are disposed on four sides of each of the microlenses 610 belonging to the first group. Specifically, the microlenses 610 belonging to the first group are disposed in odd-numbered rows and odd-numbered columns. The microlenses 610 belonging to the second group are disposed in even-numbered rows and even-numbered columns. In the fourth modification as well, the optical sensor 1 can acquire a plurality of types of information with a plurality of wavelengths. The arrangement layout of the microlenses 610 belonging to the first group and the microlenses 610 belonging to the second group is not limited to the layout of the fourth modification and can be changed as appropriate.

[Fifth Modification]

Figure 10B:
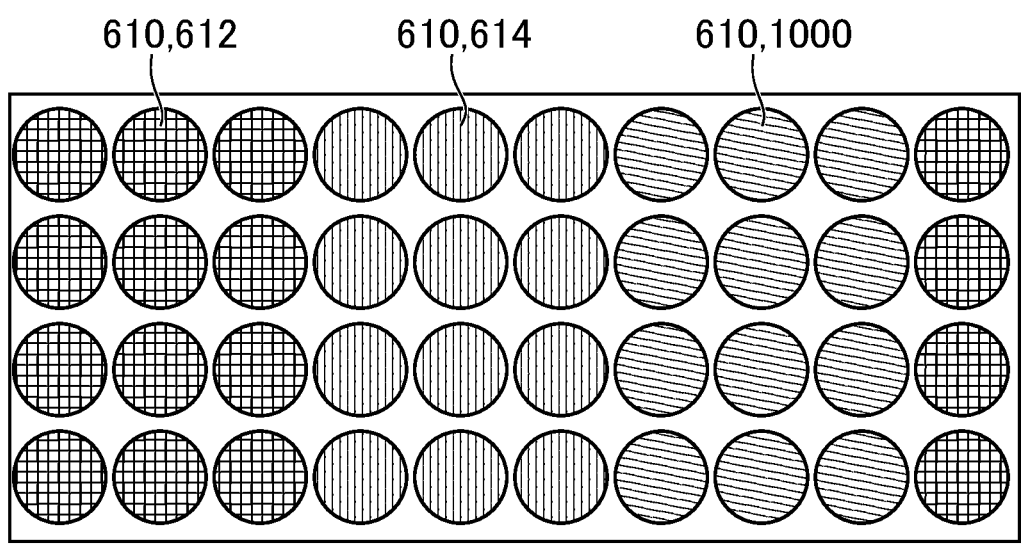

FIG. 10B is a plan view of an optical sensor 1 according to the fifth modification of the first embodiment and corresponds to FIG. 7A of the first embodiment. Descriptions of the components similar to those of the first embodiment will be omitted.

In the fifth modification, the microlenses 610 further include a plurality of microlenses 610 belonging to a third group disposed at positions respectively overlapping the pixels PX on the second transmission layer 608. Specifically, the microlenses 610 include a plurality of microlenses 610 belonging to the first group, a plurality of microlenses 610 belonging to the second group, and a plurality of microlenses 610 belonging to the third group. As described above, the microlenses 610 belonging to the first group are the first wavelength selection unit 612, and the microlenses 610 belonging to the second group are the second wavelength selection unit 614. The microlenses 610 belonging to the third group are the third wavelength selection unit 1000 that transmits light of the third wavelength. The third wavelength selection unit 1000 is, for example, a resin that transmits only light of the third wavelength (e.g., 535 nm to 575 nm centered on 555 nm).

The microlenses 610 belonging to the first group are disposed in the second direction Dy. The microlenses 610 belonging to the second group are disposed in the second direction Dy. The microlenses 610 belonging to the third group are disposed in the second direction Dy. The microlenses 610 belonging to the first group, the microlenses 610 belonging to the second group, and the microlenses 610 belonging to the third group are alternately disposed in this order in every three columns toward the first direction Dx. The layout shown in FIG. 10B is an example and can be changed as appropriate.

According to the fifth modification, three types of information can be obtained by three types of wavelengths. As such, more amount of information can be obtained at the same measuring time as compared to the embodiment described above.

Figure 11:
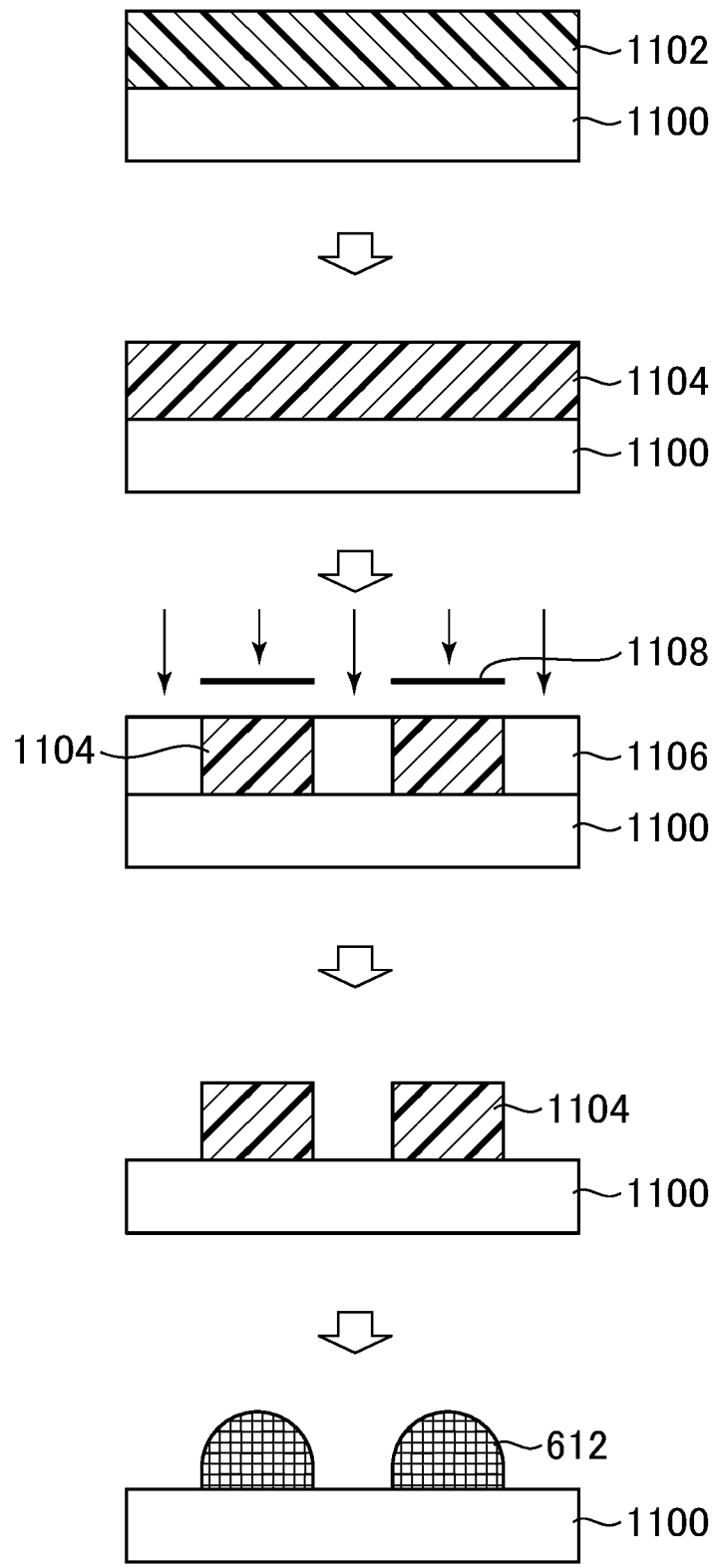
FIG. 11 is a diagram illustrating a method of manufacturing a microlens array by photolithography.

Next, a method of manufacturing the microlens array 600 according to the first embodiment will be described. FIG. 11 is a diagram for illustrating a method of manufacturing the microlens array 600 by photolithography.

First, the material of the microlens 610 is applied to the entire surface of the transparent substrate 1100. Assume that the material of the microlens 610, which is the first wavelength selection unit 612, is applied to the entire surface of the transparent substrate 1100. In a case where the microlens array 600 is manufactured by photolithography, the material of the microlens 610 is a photosensitive resin 1102. Subsequently, the entire transparent substrate 1100 is heated (pre-baked). The solvent contained in the material of the microlens 610 is thereby evaporated.

Next, a photomask on which a pattern corresponding to the layout of the microlenses 610 as the first wavelength selection unit 612 is formed is disposed on the transparent substrate 1100. Further, the transparent substrate 1100 is irradiated with ultraviolet rays. The material of the microlens 610 in the area where the pattern 1108 of the photomask is not formed is thereby exposed.

Next, development is performed. Specifically, the entire transparent substrate 1100 is immersed in a developing solution to dissolve the exposed material of the microlens 610. In this manner, the material of the microlens 610 in the unexposed area is left on the transparent substrate 1100. The material of the microlens 610 left on the transparent substrate 1100 is substantially rectangular in a cross-sectional view.

Next, heat treatment is performed. Specifically, the transparent substrate 1100 is heated at a temperature at which the material of the microlens 610 left on the transparent substrate 1100 changes to a liquid state. The material of the microlens 610 is deformed into a flat spherical shape by the surface tension. Subsequently, the material of the microlens 610 is cooled and the microlens 610 is formed into the first wavelength selection unit 612 in the shape shown in FIG. 6.

Although not shown, the same process is repeated and the microlenses 610 as the second wavelength selection unit 614 are formed on the transparent substrate 1100. Finally, the transparent substrate 1100 on which the microlenses 610 are formed is bonded to the lamination of the separately manufactured layers including from the first pinhole layer 602 to the second transmission layer 608, whereby the microlens array 600 is manufactured.

Figure 12:
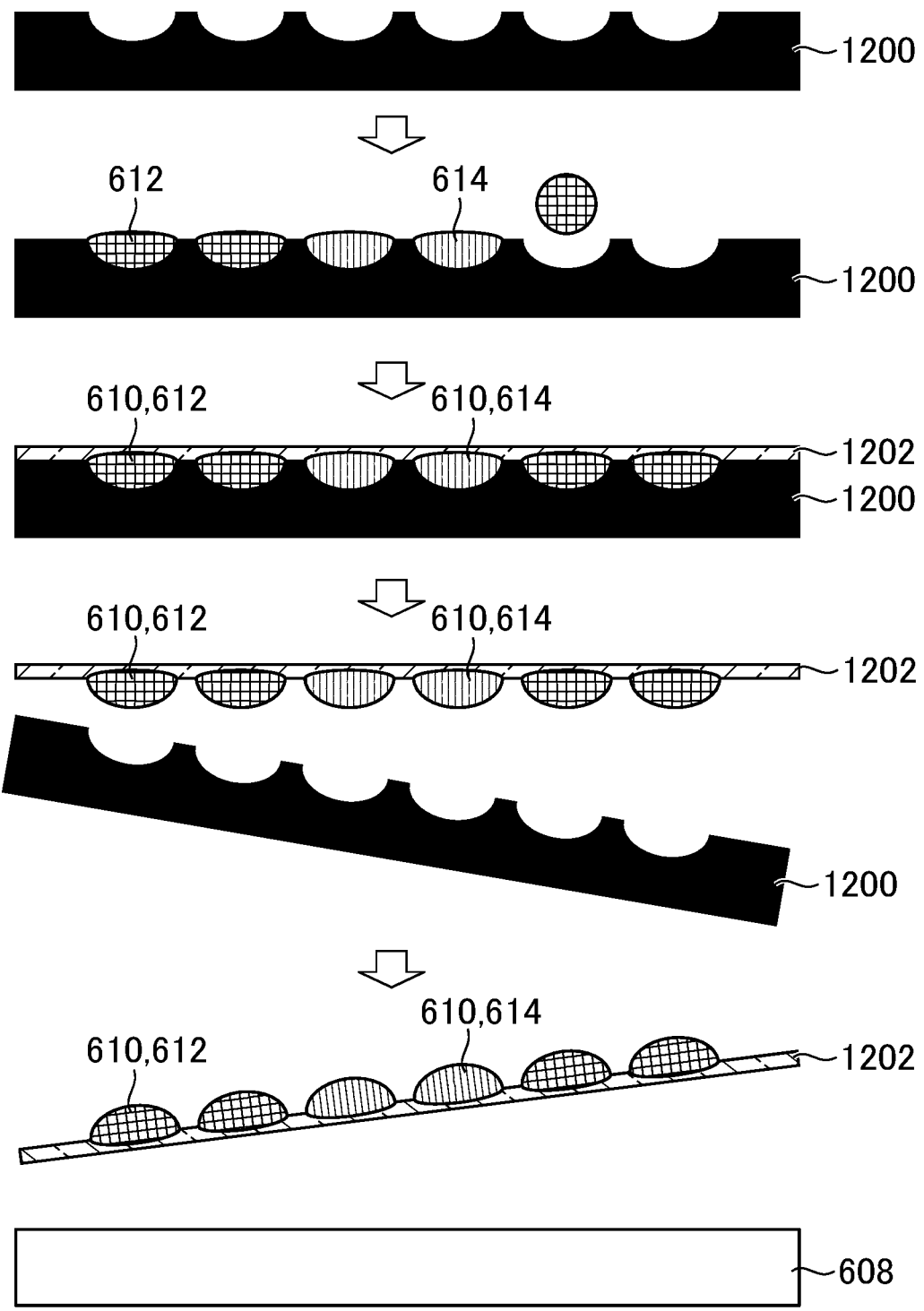
FIG. 12 is a diagram illustrating a method of manufacturing a microlens array by an ink jet method.

FIG. 12 is a diagram for illustrating a method of manufacturing the microlens array 600 by ink jet.

First, a mold 1200 is prepared. The mold 1200 has a shape corresponding to the arrangement layout of the microlenses 610 and includes recesses at positions respectively corresponding to the microlenses 610.

Next, the material of the microlens 610 is applied to the recesses of the mold 1200 by an ink jet method. For example, the material of the microlenses 610 belonging to the first group and the material of the microlenses 610 belonging to the second group are alternately applied for every two rows toward the right side in FIG. 12.

A transparent base 1202 formed of resin is applied to the entire mold 1200. Here, the base 1202 formed of resin is applied to the entire mold 1200 by a slit coating method, for example.

The base 1202 is then separated from the mold 1200. Upon separation, the microlenses 610 are attached to the base 1202 and separated from the mold 1200. Finally, the transparent base 1202 to which the microlenses 610 are attached is bonded to the lamination of the separately manufactured layers including from the first pinhole layer 602 to the second transmission layer 608, whereby the microlens array 600 is manufactured.

In the above, the methods of manufacturing the microlens array 600 by the photolithography method and the inkjet method have been described, but in the present disclosure, the microlens array 600 may be manufactured by another manufacturing method.

Second Embodiment

Figures 13A, 13B:
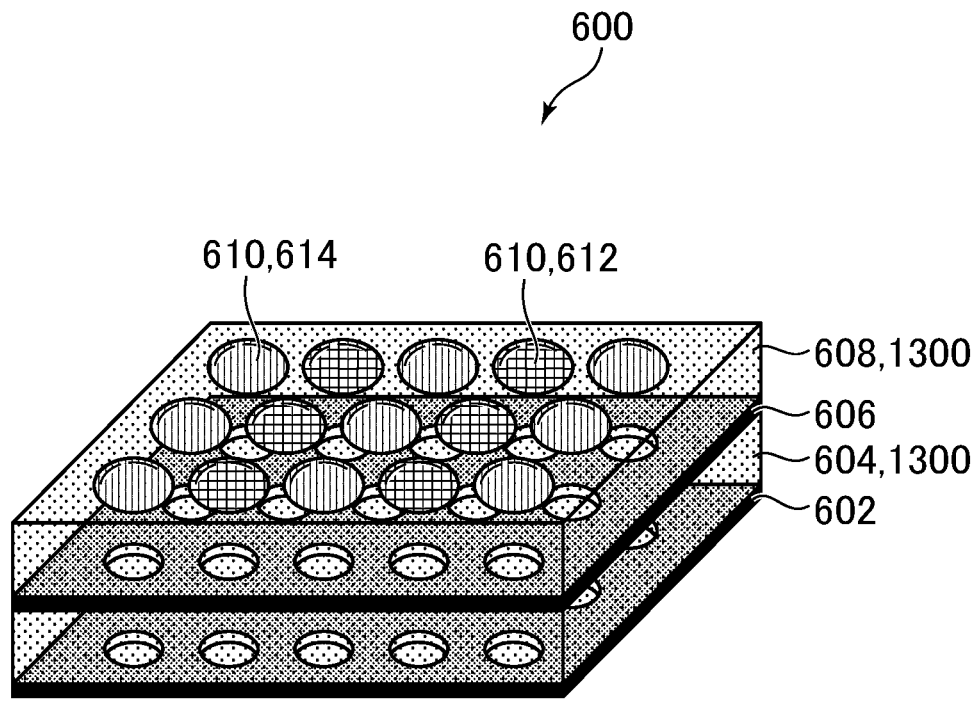
FIGS. 13A and 13B are diagrams for explaining a second embodiment.

Next, the second embodiment will be described. FIG. 13A is an overhead view of an optical sensor 1 according to the second embodiment. FIG. 13B is a diagram for illustrating transmittance. In FIG. 13B, "Red" indicates the transmittance of a first wavelength selection unit 612 of the microlens array 600, "NIR" indicates the transmittance of a second wavelength selection unit 614 of the microlens array 600, and "high-pass filter" indicates the transmittance of a first transmission layer 604 and a second transmission layer 608 of the microlens array 600. Descriptions of the components similar to those of the first embodiment will be omitted.

Similarly to the first embodiment, the microlenses 610 belonging to the first group are the first wavelength selection unit 612, and the microlenses 610 belonging to the second group are the second wavelength selection unit 614. In FIG. 13A, the microlenses 610 belonging to the first group and the microlenses 610 belonging to the second group are disposed alternately for each column toward the first direction Dx, although the arrangement layout can be changed as appropriate.

In the second embodiment, at least one of the first transmission layer 604 and the second transmission layer 608 is a filter that transmits both the light of the first wavelength and the light of the second wavelength and blocks the light of a predetermined wavelength other than the first wavelength and the second wavelength. Specifically, the first transmission layer 604 and the second transmission layer 608 in the second embodiment are high-pass filters 1300 as shown in FIG. 13B, and block light having a wavelength shorter than 640 nm and transmit light having a wavelength longer than 640 nm, for example. That is, the high-pass filter 1300 transmits light that is transmitted through both the first wavelength selection unit 612 and the second wavelength selection unit 614, and blocks light of a wavelength that should have been blocked by the first wavelength selection unit 612 and the second wavelength selection unit 614 but has been transmitted for some reason.

As such, similarly to the first embodiment, only the light of the first wavelength (e.g., 640 nm to 680 nm centered on 660 nm) reaches the partial detection area PAA in the area overlapping with the first wavelength selection unit 612 in a plan view in the second embodiment. Further, only the light of the second wavelength (e.g., 830 nm to 870 nm centered on 850 nm) reaches the partial detection area PAA in the area overlapping with the first wavelength selection unit 612 in a plan view.

In the second embodiment, the high-pass filter 1300 is provided in place of the transmission portion that transmits the entire wavelength range of visible light and infrared light in the first embodiment. The light of a wavelength that does not transmit through the first wavelength selection unit 612 and the second wavelength selection unit 614 is blocked by the high-pass filter 1300, and the optical density can be thereby improved.

The first transmission layer 604 and the second transmission layer 608 may only need to transmit the wavelength of the light that transmits through the first wavelength selection unit 612 and the second wavelength selection unit 614, and thus are not limited to the high-pass filter 1300 and may be a band-pass filter or a low-pass filter.

Third Embodiment

Figure 14A:
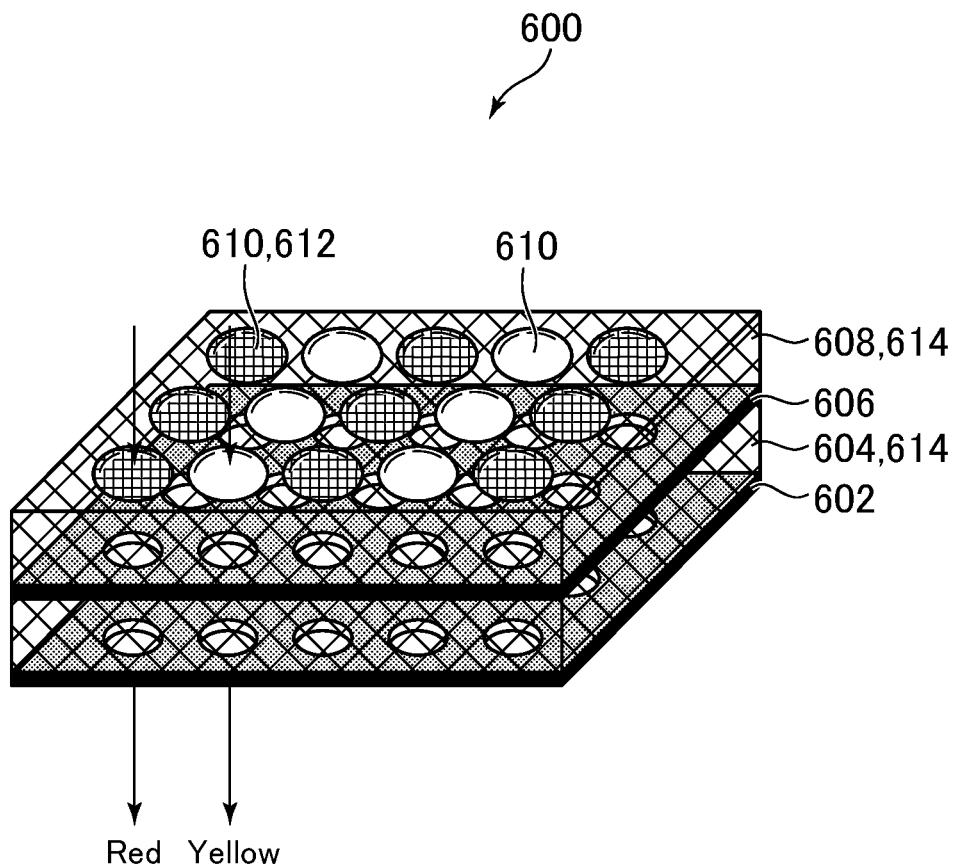
FIGS. 14A and 14B are diagrams for explaining a third embodiment.
Figure 14B:
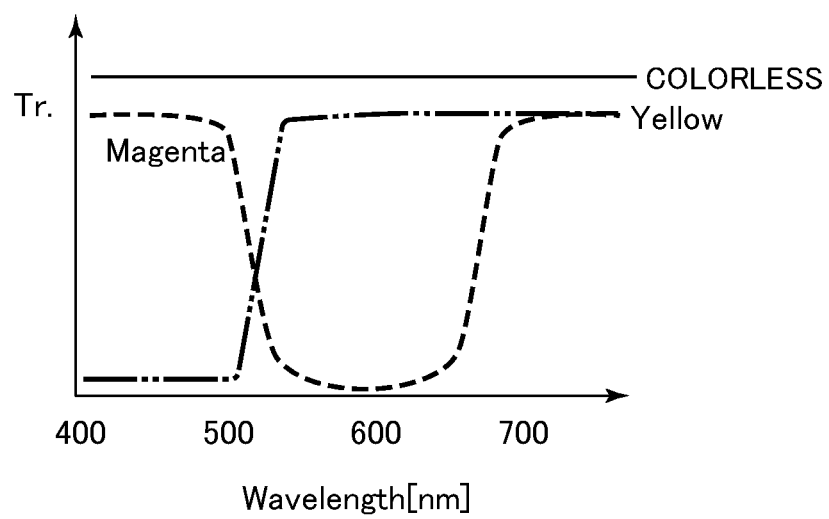

Next, the third embodiment will be described. FIG. 14A is an overhead view of an optical sensor 1 according to the third embodiment. FIG. 14B is a diagram for illustrating transmittance. In FIG. 14B, "Magenta" indicates the transmittance of the microlenses 610 belonging to the first group, "colorless" indicates the transmittance of the microlenses 610 belonging to the second group, and "Yellow" indicates the transmittance of the first transmission layer 604 and the second transmission layer 608. Descriptions of the components similar to those of the first embodiment will be omitted.

In the third embodiment, the microlenses 610 belonging to either the first group or the second group are the first wavelength selection unit 612. Specifically, for example, the microlenses 610 belonging to the first group are the first wavelength selection unit 612. The microlenses 610 belonging to the first group transmit only light of the first wavelength (e.g., 500 nm or less and 700 nm or more). The microlenses 610 belonging to the second group transmit the entire wavelength range of visible light and infrared light.

At least one of the first transmission layer 604 and the second transmission layer 608 is the second wavelength selection unit 614. Specifically, the first transmission layer 604 and the second transmission layer 608 are the second wavelength selection unit 614 that transmits only light of the second wavelength (e.g., 500 nm or more).

According to the third embodiment, red light enters the pixel PX corresponding to the microlens array 600 belonging to the first group. Yellow light enters the pixel PX corresponding to the microlens array 600 belonging to the second group. As in the third embodiment, even if the microlenses 610 belonging to either the first group or the second group are made transparent, at least one of the first transmission layer 604 and the second transmission layer 608 is the second wavelength selection unit 614, and thus the optical sensor 1 can obtain a plurality of types of information by a plurality of wavelengths.

While there have been described what are at present considered to be certain embodiments of the invention, it will be understood that various modifications may be made thereto, and it is intended that the appended claims cover all such modifications as fall within the true spirit and scope of the invention.

The invention claimed is:

1. An optical sensor comprising:
   a light receiving unit that includes a plurality of pixels disposed in a matrix on a plane and receives light from a measurement target;
   a first pinhole layer that includes a plurality of pinholes provided at positions respectively overlapping the plurality of pixels;
   a first transmission layer that is disposed on the first pinhole layer and transmits light;
   a second pinhole layer that includes a plurality of pinholes provided at positions respectively overlapping the plurality of pixels and is disposed on the first transmission layer;
   a second transmission layer that is disposed on the second pinhole layer and transmits light; and
   a plurality of microlenses belonging to a first group and a plurality of microlenses belonging to a second group, the microlenses being disposed at positions respectively overlapping the plurality of pixels on the second transmission layer, wherein
   either of the plurality of microlenses belonging to the first group or the plurality of microlenses belonging to the second group are a first wavelength selection unit that transmits light of a first wavelength, and
   at least one of the other of the plurality of microlenses belonging to the first group and the plurality of microlenses belonging to the second group, the first transmission layer, and the second transmission layer is a second wavelength selection that transmits light of a second wavelength.

2. The optical sensor according to claim 1, wherein
   the plurality of microlenses belonging to the first group are the first wavelength selection unit,
   the plurality of microlenses belonging to the second group are the second wavelength selection unit, and
   the second group is provided adjacent to the first group.

3. The optical sensor according to claim 1, wherein
   the plurality of microlenses belonging to the first group are the first wavelength selection unit,
   the plurality of microlenses belonging to the second group are the second wavelength selection unit, and
   the microlenses belonging to the second group are disposed four sides of each of the microlenses belonging to the first group.

4. The optical sensor according to claim 1, wherein
   the plurality of microlenses belonging to the first group are the first wavelength selection unit,
   the plurality of microlenses belonging to the second group are the second wavelength selection unit,
   at least one of the first transmission layer or the second transmission layer is a filter that transmits light of both the first wavelength and the second wavelength and blocks light of a predetermined wavelength other than the first wavelength and the second wavelength.

5. The optical sensor according to claim 1, wherein
   the first wavelength is shorter than the second wavelength, and
   each of pinholes of the first pinhole layer disposed at positions corresponding to the plurality of microlenses belonging to the first group has a smaller diameter than each of pinholes of the first pinhole layer disposed at positions corresponding to the plurality of microlenses belonging to the second group.

6. The optical sensor according to claim 1, wherein
   the first wavelength is shorter than the second wavelength, and
   each of the plurality of microlenses belonging to the first group has a larger diameter than each of the plurality of microlenses belonging to the second group.

7. The optical sensor according to claim 1, wherein
   the first wavelength is shorter than the second wavelength, and
   the plurality of microlenses belonging to the first group are lower in height than the plurality of microlenses belonging to the second group.

8. The optical sensor according to claim 1, further comprising a plurality of microlenses belonging to a third group provided at positions respectively overlapping the plurality of pixels on the second transmission layer, wherein
   the plurality of microlenses belonging to the third group are a third wavelength selection unit that transmits light of a third wavelength.

9. The optical sensor according to claim 1, wherein
   the plurality of microlenses belonging to one of the first group or the second group is the first wavelength selection unit, and
   at least one of the first transmission layer or the second transmission layer is the second wavelength selection unit.

* * * * *